United States Patent [19]
Villa

[11] Patent Number: 5,818,257
[45] Date of Patent: Oct. 6, 1998

[54] CMOS INTERFACE FOR COUPLING A LOW VOLTAGE INTEGRATED CIRCUIT WITH DEVICES POWERED AT A HIGHER SUPPLY VOLTAGE

[75] Inventor: Nuccio Villa, Roncello, Italy

[73] Assignee: SGS-Thomson Microelectronics S.r.l., Agrate Brianza, Italy

[21] Appl. No.: 749,971

[22] Filed: Nov. 14, 1996

[30] Foreign Application Priority Data

Nov. 16, 1995 [EP] European Pat. Off. .............. 95830483

[51] Int. Cl.⁶ ................... H03K 19/0185; H03K 19/017
[52] U.S. Cl. .................. 326/81; 326/17; 326/86
[58] Field of Search ................ 326/68, 80–81, 326/83, 86, 17, 27

[56] References Cited

U.S. PATENT DOCUMENTS

| | | |
|---|---|---|
| 5,179,297 | 1/1993 | Hsueh et al. . |
| 5,300,832 | 4/1994 | Rogers . |
| 5,381,059 | 1/1995 | Douglas ..................... 326/58 |
| 5,381,062 | 1/1995 | Morris ....................... 326/68 |
| 5,440,249 | 8/1995 | Schucker et al. ........... 326/81 |
| 5,495,184 | 2/1996 | Des Rosiers et al. ....... 326/83 |
| 5,559,464 | 9/1996 | Orii et al. ................. 326/81 |

*Primary Examiner*—Jon Santamauro
*Attorney, Agent, or Firm*—Allen, Dyer, Doppelt, Milbrath & Gilchrist, P.A.

[57] ABSTRACT

An interface circuit for coupling the output of an integrated circuit designed for a relatively low supply voltage to a circuit designed to operate at a higher supply voltage employs a cascoded architecture and makes use of two purposely derived reference voltages. The circuit comprises a level rising stage, an output buffer stage (off chip driver stage), an overdrive stage for the pull-up device of the output buffer and a drain follower stage, the pull-up element of which is driven by a second output node of the level rising stage and the pull-down element of which is driven by the inverted input data stream.

11 Claims, 11 Drawing Sheets

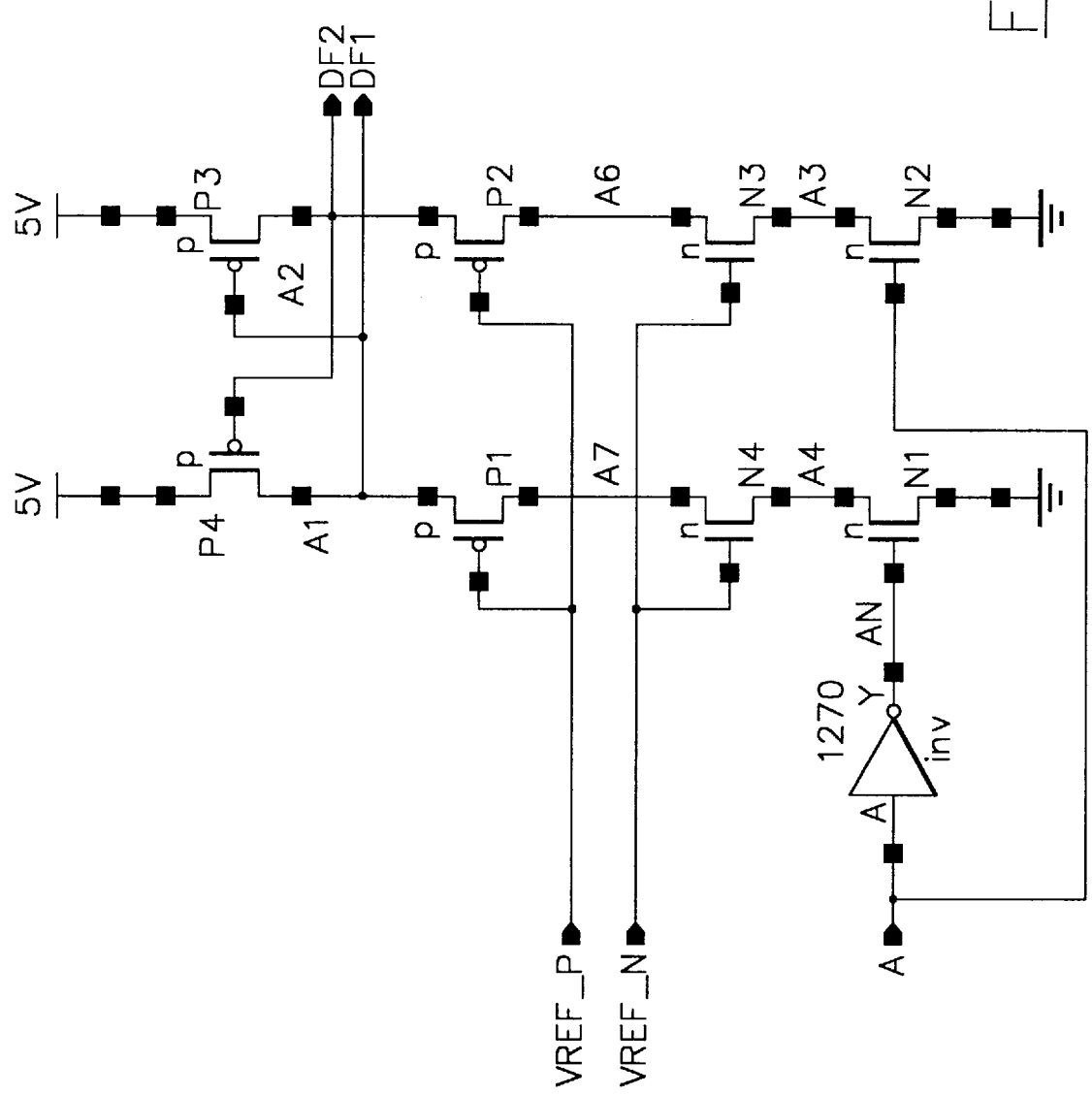

CMOS INTERFACE FOR COUPLING A LOW VOLTAGE INTEGRATED CIRCUIT WITH DEVICES POWERED AT A HIGHER SUPPLY VOLTAGE

FIELD OF THE INVENTION

The present invention relates to integrated circuits. More particularly, the present invention relates to low voltage integrated circuits interfacing with devices or circuits functioning at a higher voltage.

BACKGROUND OF THE INVENTION

To achieve a higher scale of integration and speed of integrated circuits, designers are constantly reducing physical dimensions of single circuit components. This reduction of the physical dimensions brings about the need of decreasing the supply voltage of the integrated circuit.

For example, MOS transistors contained in today's ICs of a high scale of integration are fabricated with a smaller channel length than MOS transistors of older generation ICs that had a lower scale of integration. Consistently with a reduction of the channel length, also the gate oxide layer of the MOS transistors must be proportionally reduced in thickness. However, thinner dielectric layers limit the voltage level they can safely withstand and consequently ICs must be powered at lower supply voltage. For example, many MOS integrated circuits of the new generation operate with a supply voltage of 3.3V rather than a supply voltage of 5.0V, as it was common in prior generation ICs.

On the other hand, in many applications, ICs designed for relatively low supply voltage must be interfaced with other ICs and buses operating at higher voltages. If a low voltage integrated circuit is directly coupled to a relatively high voltage environment, the thin gate oxide film of the transistors of output stages may rapidly deteriorate. This gradual deterioration of the gate dielectric characteristics leads to unreliability and ultimately to a failure in a relatively short period of time.

In addition, the driving of an integrated circuit operating at 5V with a signal coming from a device of high scale of integration of a more recent generation and which switches for example between 0 and about 3V, can increase power consumption excessively in input stages of the device functioning at 5V. Especially in an area of transition as the present, the industry requires the possibility of exploiting the benefits deriving from the employment of new devices of high scale of integration while requiring an electric compatibility with preexistent and still widely used 5V ICs.

To overcome these compatibility problems of electric nature, various solutions have been proposed. According to a first approach, schematically shown in FIG. 1, it is possible to adjust the fabrication process not in terms of which would be the limitations dictated by the nominal operative voltage of the circuit, but according to more restrictive limits imposed by the higher voltages occurring in output interfacing stages toward a higher voltage environment. According to this approach, voltage shifting structures may be used, according to well known techniques.

This solution has obvious drawbacks because the single transistor cannot be optimized any longer in terms of speed and current delivering characteristics by not being able to take full advantage of the technological possibilities offered by the high scale of integration process. It may occur to obligingly require the availability and implementation of "two" processes, the first with a reduced gate oxide thickness for optimized speed and current performances and the second with a thicker oxide thickness to be used in lieu of the first process whenever the specifications require the capability of interfacing with devices operating at a higher voltage. Unfortunately, such an approach may be burdensome and costly.

A similar but more efficient approach, is that of designing and fabricating these ICs with an increased gate oxide thickness exclusively in the devices that form the output stages and that may be directly coupled to an environment operating to a higher supply voltage, the intention being that of limiting the penalty to be paid in terms of reduction of the speed of the whole ICs. In this case, the drawback is due to the increased complexity of the fabrication process which has negative repercussions on reliability and yield.

A third approach is that of realizing special cascoded circuits capable of keeping a certain balanced difference of potential across the gate dielectric. This approach, even if it imposes non-negligible design problems, offers an intrinsic adaptability to different or changeable conditions of application. An example of this technique is shown in FIG. 2.

So-called 5V TOLERANT devices, for example, devices provided with output buffer stages powered at 3.3V, realized in floating n-wells for autoprotection when the macrocell is set in a tristate condition (high impedance) and the output node is coupled to 5V, may be ascribed to the latter category.

A further so-called 5V CAPABLE category includes devices provided with output buffer stages that comprise level boosting stages capable of interfacing circuitry functioning at 3V with an environment powered at 5V.

A solution of this latter type is described in the U.S. Pat. No. 5,300,832, by Alan C. Rogers, assigned to Sun Microsystems, Inc., California, U.S.A. According to this known technique, the output buffer stage is composed by a pull-down circuit and a pull-up circuit and the MOS transistors of the pull-up circuit are formed in n-well regions dynamically biased so as to ensure the preservation of junction isolation. The input circuit senses the voltage on the output node and isolates the integrated circuit from the high voltage swing of the output node. This solution, being essentially based on a latch-up scheme, neglects the need of maintaining a minimum encumbrance to ensure a high speed.

SUMMARY OF THE INVENTION

An improved circuit, object of the present invention, has now been found permitting the interfacing of a low supply voltage integrated circuit with a higher voltage environment that ensures a high signal propagation speed while being particularly simple to integrate and allowing a relatively compact circuit.

The solution object of the present invention follows the above-mentioned third kind of approach involving the use of cascode circuits for maintaining a certain voltage balance across the gate dielectric of the devices of the stages that interface with a higher supply voltage environment.

According to an aspect of the invention, the circuit of the invention makes use of two reference voltages which may be derived from the supply voltages (VDD high and VDD low) themselves or alternatively they may be purposely generated, one for the n-channel part and one for the p-channel part, respectively.

The circuit comprises a level rising stage having a cascode structure, wherein the n-channel section is cascoded by means of an n-channel transistor whose gate is coupled to a respective reference voltage Vref_n and the p-channel section is cascoded by means of a p-channel transistor whose gate is coupled to another reference voltage Vref_p. The stage is driven by an input data direct signal and by its respective inverted signal and produces a corresponding output data signal switching between the high supply voltage (VDD high) of the environment to which the circuit is coupled and a voltage that is given by the difference between the same high voltage supply (VDD high) and the reference voltage Vref_p, increased by the voltage drop across a p-channel transistor.

The output buffer stage (off-chip driver) which is driven by the output is similar to the level rising stage, and has a cascoded structure too. The n-channel part is cascoded by means of an n-channel transistor whose gate is coupled to the respective reference voltage Vref_n and the p-channel part is cascoded by means of a p-channel transistor whose gate is coupled to the respective voltage reference Vref_p.

According to the present invention, the circuit further preferably comprises a stage for overdriving the pull-up p-channel device of the output buffer stage, comprising an n-channel diode, functionally connected between the driving node of the p-channel pull-up element of the output buffer, and the respective output node of the level rising stage, and a drain follower stage, whose pull-up element is driven by the other output of the level rising stage, while the n-channel pull-down element is driven by the inverted input data signal. Preferably, the drain follower stage has its own p-channel branch cascoded by means of a p-channel transistor whose gate is coupled to the respective reference voltage and the n-channel branch includes at least an n-channel diode.

The circuit effectively protects the output buffer transistors by balancing the voltage on their gate/source and gate/drain junctions. Therefore, the interfacing circuit of the invention is useful for realizing bi-directional I/O cells having, for instance, a "5V CAPABLE" output and a "5V TOLERANT" input. The n-channel diode in series to the driving line of the p-channel pull-up device of the output buffer, ensures a more efficient level of overdrive, whereas the drain follower stage accelerates the rise and fall of the voltage on the driving node, thus improving the speed performance of the interface.

BRIEF DESCRIPTION OF THE DRAWINGS

The various aspects and relative advantages of the circuit of this invention will be even more evident through the following detailed description of an important embodiment for making a device powered at 3.3V (+10%, −20%) compatible with an environment operating at 5V±10% and by referring to the attached drawings, wherein:

FIG. 5 is a partial circuit scheme of the present invention that highlights the structure of the voltage rising stage;

FIG. 7b shows an alternative embodiment of the present invention of the driving stage of FIG. 7a;

DETAILED DESCRIPTION OF PREFERRED EMBODIMENTS

Figure 1:
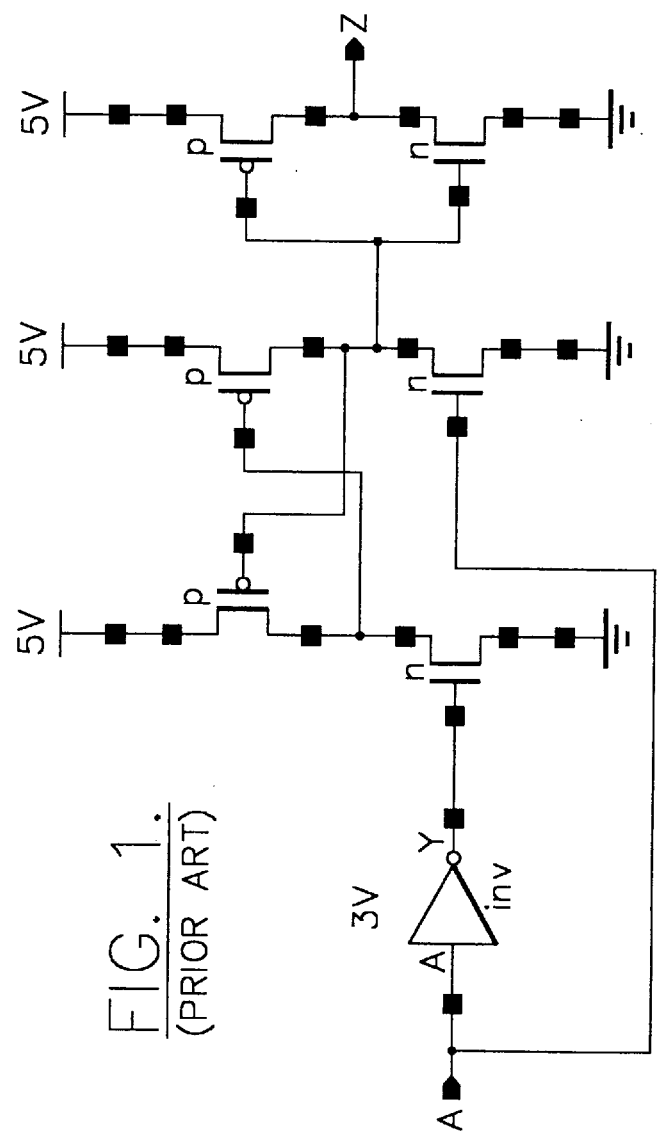
FIG. 1 illustrates an interface circuit of the prior art realized with devices designed for withstanding a high voltage (5V) across their gate oxide, as already discussed above.
Figure 2:
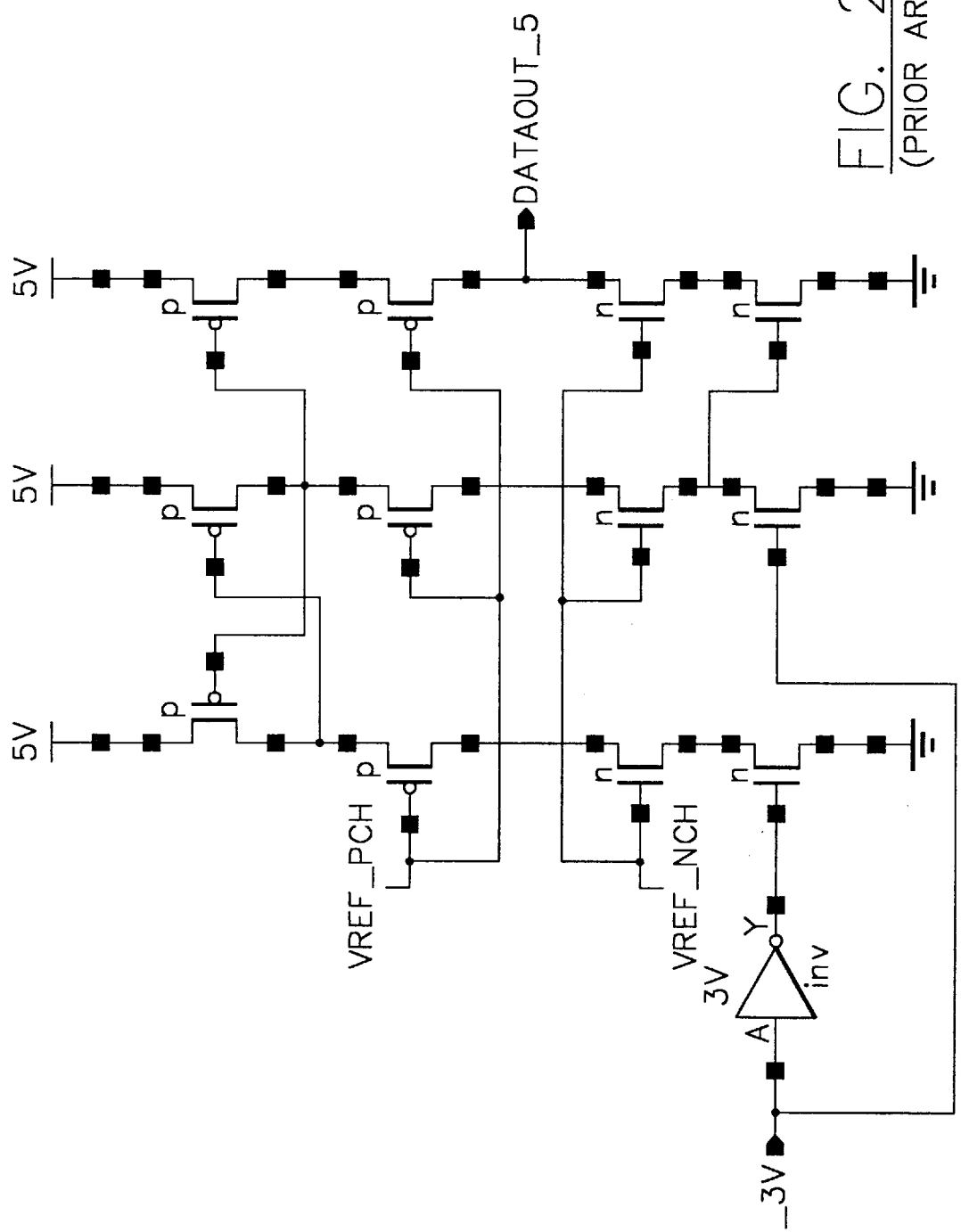
FIG. 2 shows an interface circuit of the prior art employing transistors intrinsically unable of withstanding a high voltage (5V) across their gate oxide, wherein, through cascode arrangements a certain balancing of the voltage across the gate dielectric is ensured, according to a well known technique as mentioned above.
Figure 3:
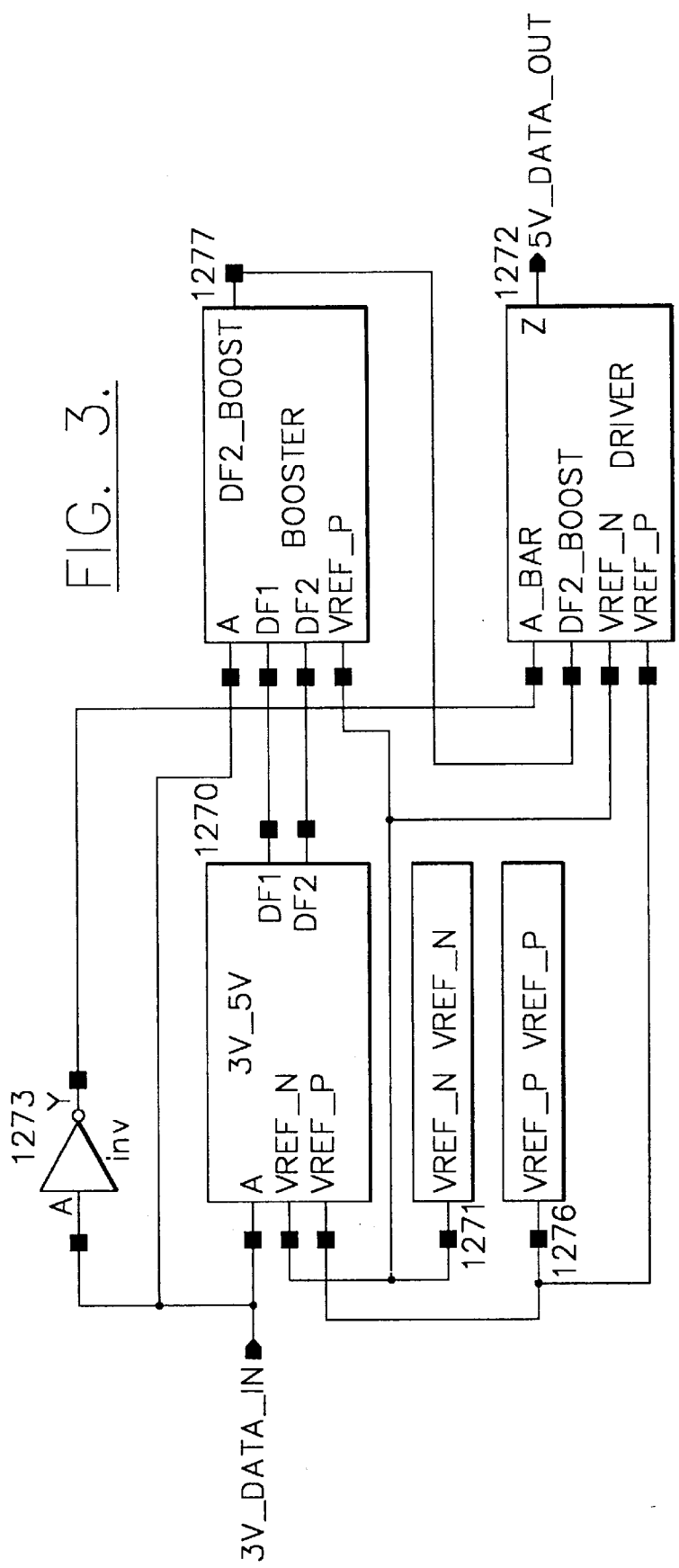
FIG. 3 is a high level diagram showing the circuit blocks of the interface circuit of the invention.

The circuit sections of a complete interface circuit according to the present invention, shown as a whole in the block diagram of FIG. 3, are hereinbelow described individually for ease of description.

GENERATION OF THE REFERENCE VOLTAGES

Figure 4B:
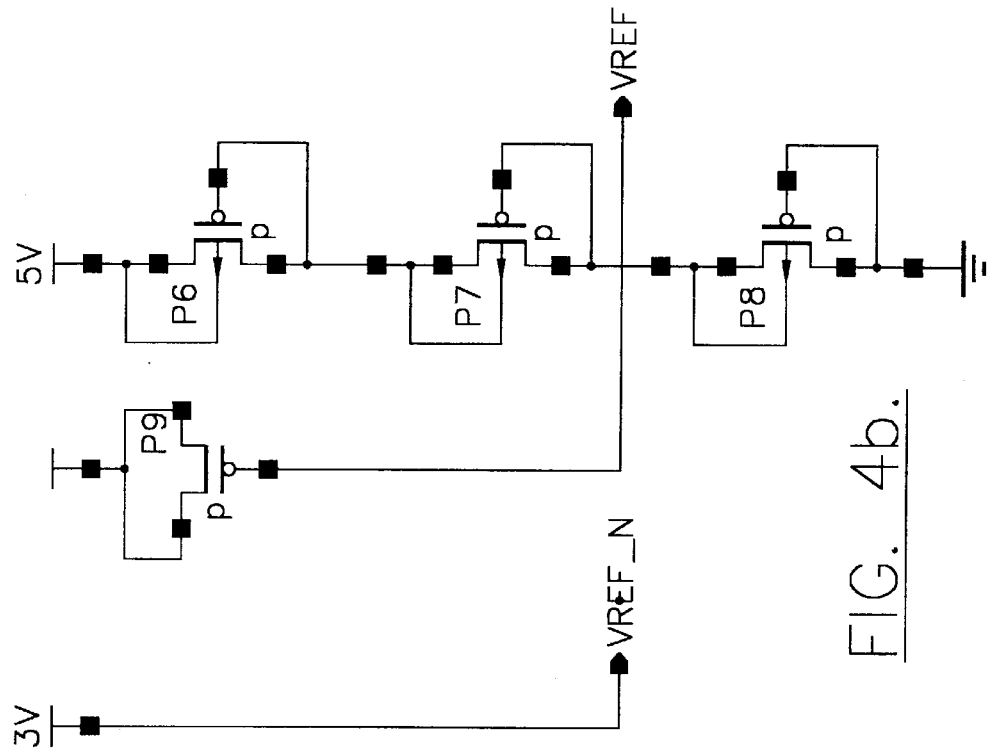
FIG. 4a, 4b and 4c are partial circuit schemes of the present invention highlighting how reference voltages for the n-channel and p-channel cascading transistors may be generated.
Figure 4A:
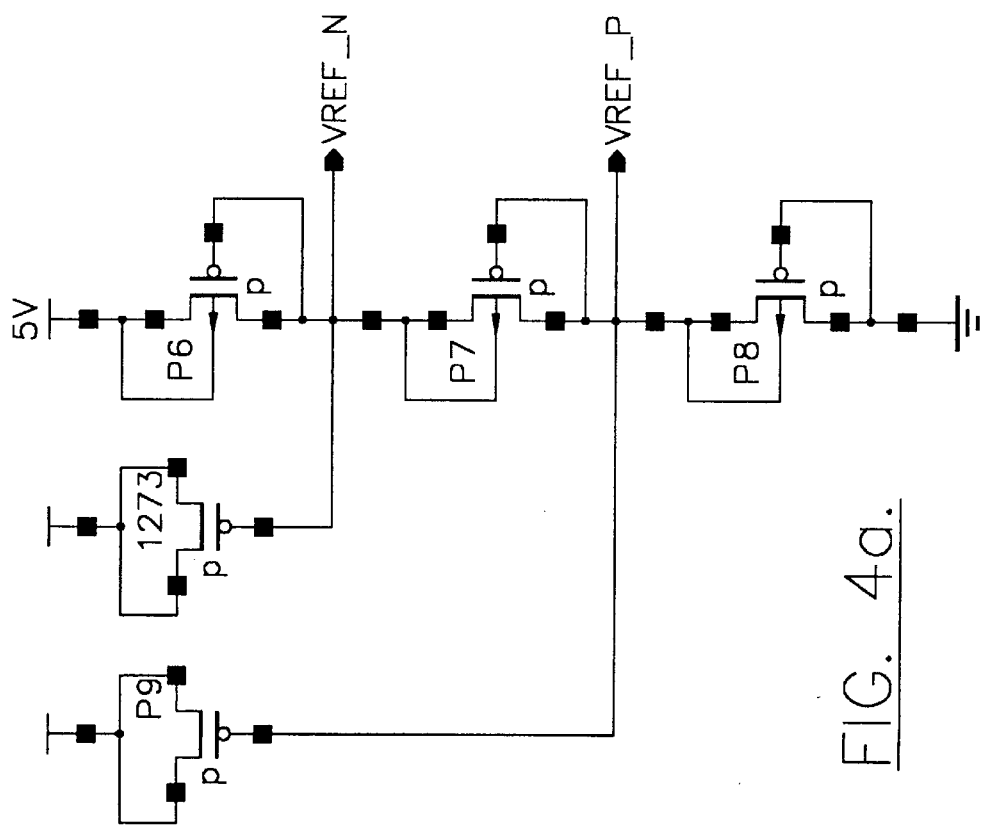

A satisfactory circuit structure for generating the reference voltages Vref_p and Vref_n is shown in FIG. 4a. The reference voltages Vref_p and Vref_n are instrumental, as will become clearer through the following description, for ensuring a protection of the gate oxide of transistors subject to the high voltage, by keeping the difference of potential between the gate and the drain and source diffusions of p-channel and n-channel transistors of the different stages that make up the interface circuit of the invention, below a limit value on account of the physical characteristics of the devices and which is defined by the following equations:

| | | |
|---|---|---|
| VDD high − Vref_p | $\leq$ VMAX | (1.1) |
| Vref_p | $\leq$ VMAX | (1.2) |
| Vref_n − GND | $\leq$ VMAX | (2.1) |
| VDD high − Vref_n | $\leq$ VMAX | (2.2) | where VMAX is the maximum voltage applicable to the gate oxide and which generally corresponds to the maximum value of VDD low, for instance 3.3V+10%=3.6V. The above relationships must be satisfied for the entire range of VDD high (for example: 5V±10%) and of VDD low (for example: 3.3V+10% to 3.3V−20%).

A circuit for generating the reference voltage Vref_p may be composed a chain of a variable number of P-MOS transistor, such as to provide a partition of the high supply voltage, whereby Vref_p may be derived from an intermediate voltage tap. This reference voltage Vref_p is applied to the gate of cascoding p-channel transistors that are employed where it is necessary to maintain the difference of potential across the gate oxide of p-channel transistors below the limits set by the equations (1.1) and (1.2).

As far as the other reference voltage Vref_n is concerned, this may be available through a direct connection to VDD low, according to the scheme shown in FIG. 4b, otherwise it may be derived from a tap of a voltage divider line of the high supply voltage, similarly to Vref_p, as shown in FIG. 4a. Alternatively, according to an important embodiment of the invention, it is possible to employ dedicated generators for generating both reference voltages, substantially independent from variations of the supply voltages, as it will be illustrated below.

Figure 4C:
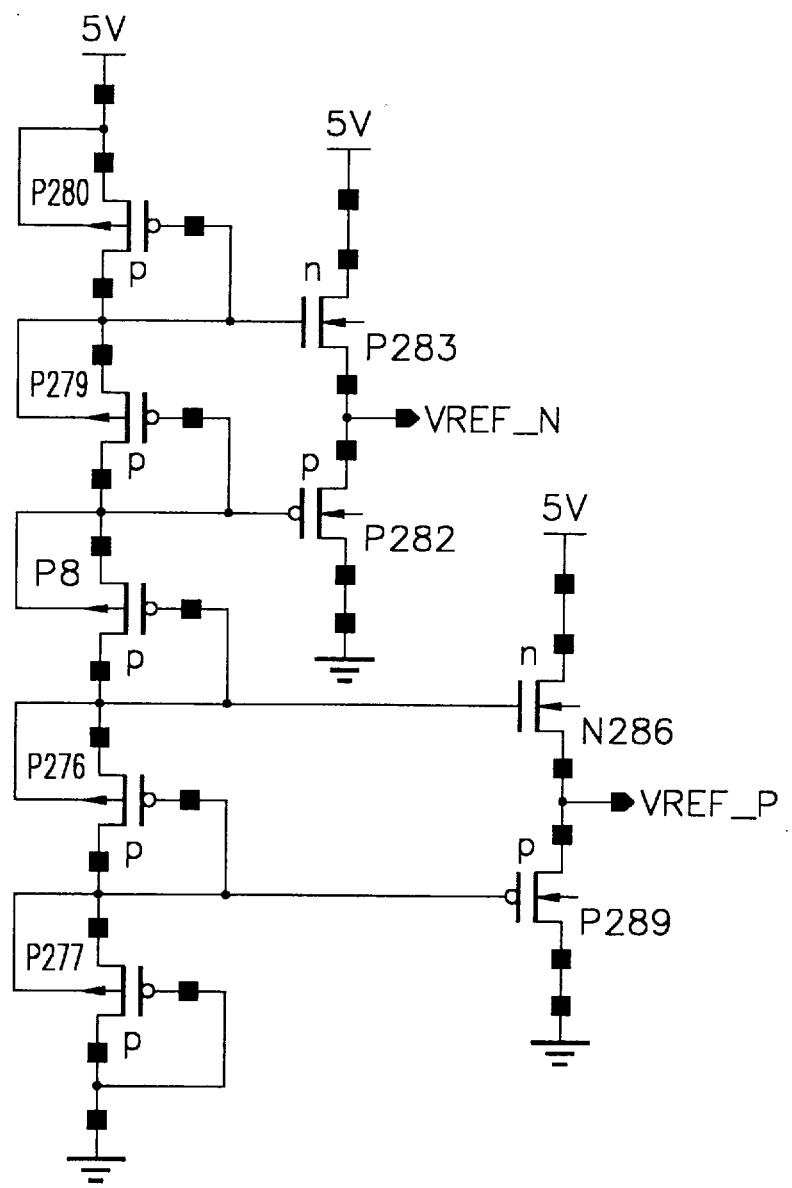

The circuits for generating the required reference voltages can be realized in any suitable form of the innumerable known forms and they may contemplate the addition of capacitive decoupling elements or be realized with source follower stages, as in the example illustrated in FIG. 4c, or with voltage follower stages.

LEVEL RISING STAGE

By referring to FIG. 5, the level rising stage is illustratively constituted by a cascode structure. The n-channel section is cascoded by means of an n-channel transistor, whose gate can be directly coupled to the low supply voltage (3V), whereas the p-channel sections are cascoded by means of a p-channel transistor whose gate is coupled to the reference voltage Vref_p.

The level rising stage is driven by the input data stream A and by the inverted signal (of opposite phase) AN. Starting from a condition where A is low, the AN phase will be high, that is at 3V. The node A3 will be at $3V-V_{t-n}$ while the node A4 will be low. The node A7 will be also low and the node A6 will be at 5V. The output A1 (DF1) will be low and precisely at a voltage given by $5V-Vref\_+V_{t-p}$, while the output A2 (DF2) will be high, practically at 5V.

When the input signal A becomes high, AN becomes low, the internal nodes A3 and A4 switch, between the ground potential and the voltage given by $3V-V_{t-n}$, respectively, whereas of the other pair of nodes, A7 rises to 5V while A6 drops to ground potential. The output A1 (DF1) rises to 5V while the output A2 (DF2) drops to a potential given by $5V-Vref\_p+V_{t-p}$.

OVERDRIVING STAGE

Figure 6:
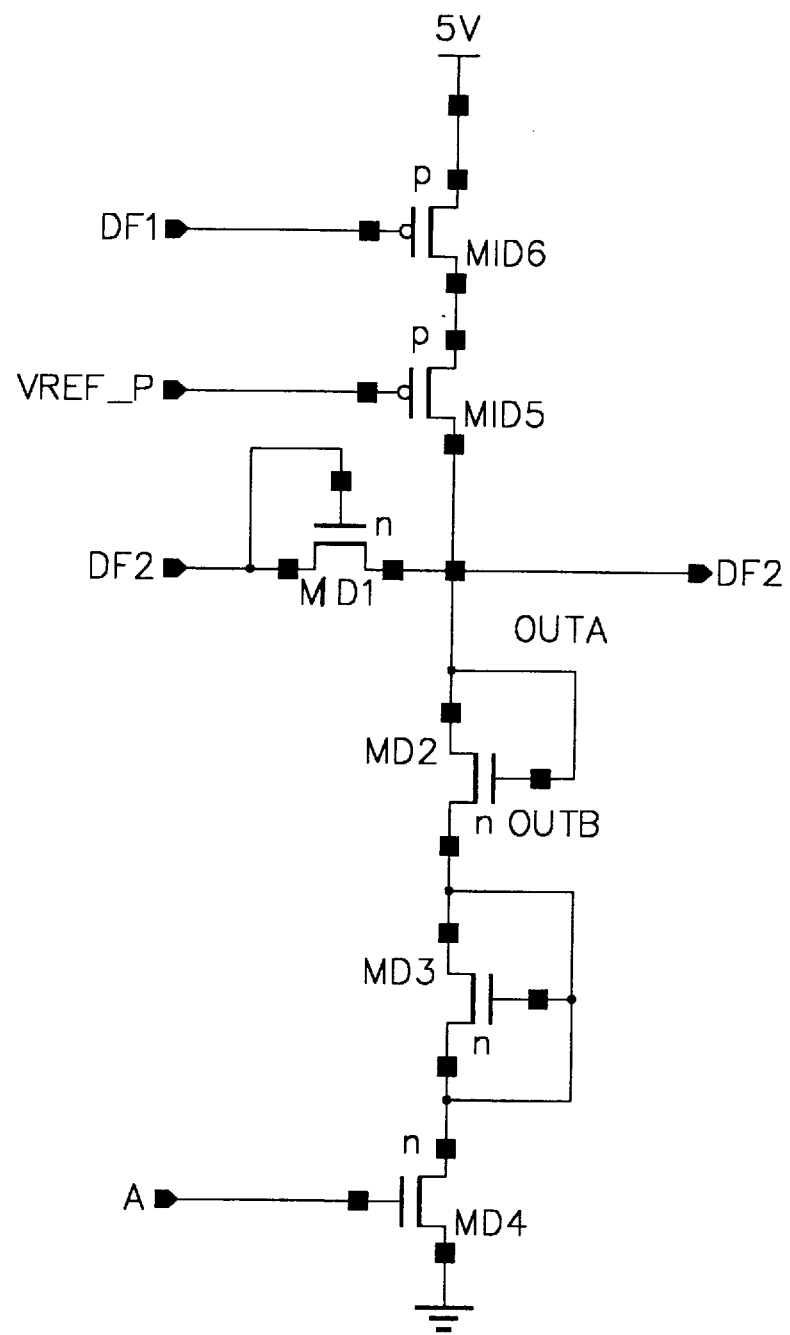
FIG. 6 is a partial scheme of the present invention of the overdriving stage of the pull-up element of the output buffer stage.

By referring to FIG. 6, an essential aspect of the circuit of the invention is the presence of an overdriving stage of the p-channel pull-up device of the output buffer stage (off-chip driver), which comprises in essence an n-channel diode coupled in series on the driving line of the pull-up device of the output buffer and a drain follower stage having a cascode architecture. The stage may be composed by the transistors of the cascoded pull-up section of the drain follower stage formed by MD6 and MD5, by the n-channel diode MD2 and by the transistor MD4 of the pull-down section drain follower stage.

Eventually, a second diode MD3 may be inserted, in case the variation range of VDD high exceeds 5.5V. The stage, besides ensuring an adequate overdriving, increases the speed of rise and fall of the driving node voltage of the pull-up transistor of the output buffer.

OFF-CHIP DRIVER (OUTPUT BUFFER)

Figure 7A:
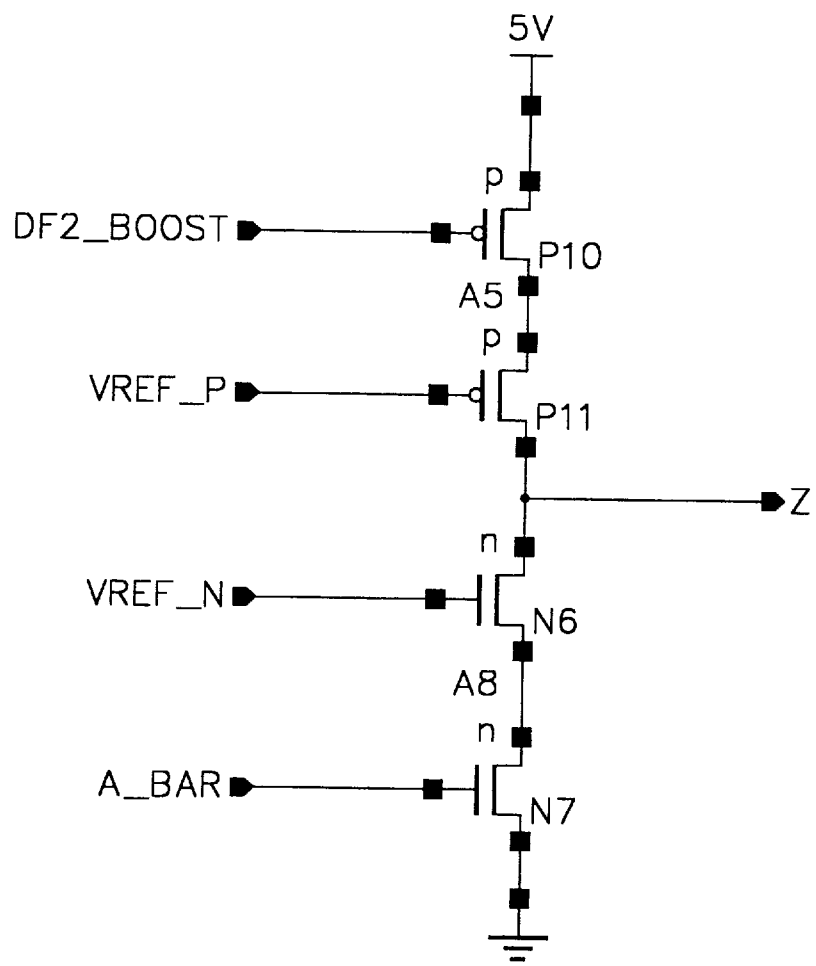
FIG. 7a is a partial scheme of the present invention of the driving stage of the output buffer, according to the present invention.

The output buffer can have a structure as shown in FIG. 7a. The p-channel transistors, MD6 and MD5, belonging to the drain follower of the overdriving stage act as boosters during the rise of the voltage transient on the driving node of the pull-up transistor P10 of the output buffer, while MD2 and MD4 provide for a fast discharge path of the driving node.

In prior art cascoded structures, the p-channel section of the output buffer stage, is driven with a signal variable within the following voltage ranges:

| Low logic level | High logic level |
| --- | --- |
| Vref_p + VTp | VDD high |

Since to p-channel transistors may be attributed a driving capacity proportional to the absolute value of VGS-VTp (voltage between the gate and the source less the threshold voltage of the transistor), it occurs that in cascoded structures of prior generation devices the overdriving of the p-channel part be proportional to:

$$VDD \text{ high} - (Vref\_p + VTp) - Vtp$$

As noted, there exist a VTp term that contributes to reduce the overdriving of the p-channel section of the output buffer below the maximum level allowed by the constrains of equations 1.1, 1.2, 2.1, 2.2.

This represents a factor of turn-off loss in respect to the theoretical efficiency permitted by the aforementioned equations. In these circuits the VTp term may be estimated to be about 1V, and therefore the loss of performance is rather sensitive.

Indeed, in a saturation state, the current in a transistor is proportional to the square of the voltage between the gate and the source. By passing from an overdrive proportional to 2V to one proportional to 3V, the current pulled by the p-channel transistor increases by a factor equal to 9 rather than to 4.

According to an aspect of the invention, an n-channel transistor, MD1, configured as a diode (FIG. 6), is connected in series between the output A2 (DF2) of the level rising stage (FIG. 5) and the driving (gate) node of the p-channel transistor P-10 of the output buffer (FIG. 7a), in order to lower the gate voltage of the P10 transistor by a quantity VTn, approximately equal to VTp, so that the overdrive of the pull-up transistor P10 of the output buffer is, for the example shown, given by the following expression:

$$VDD \text{ high} - Vref\_p - VTp - VTp + VTn \approx VDD \text{ high} - Vref\_p - VTp$$

The drain follower stage, inserted between the voltage rising stage and the output buffer stage, permits the adjustment of the negative term VTp, when necessary, or in other words, only during the switch-up phase of the output node, while maintaining, during the switch-down phase of the output node, the high logic value VDD high. This avoids current flows between the supply rail and ground in absence of transitions.

Figure 7B:
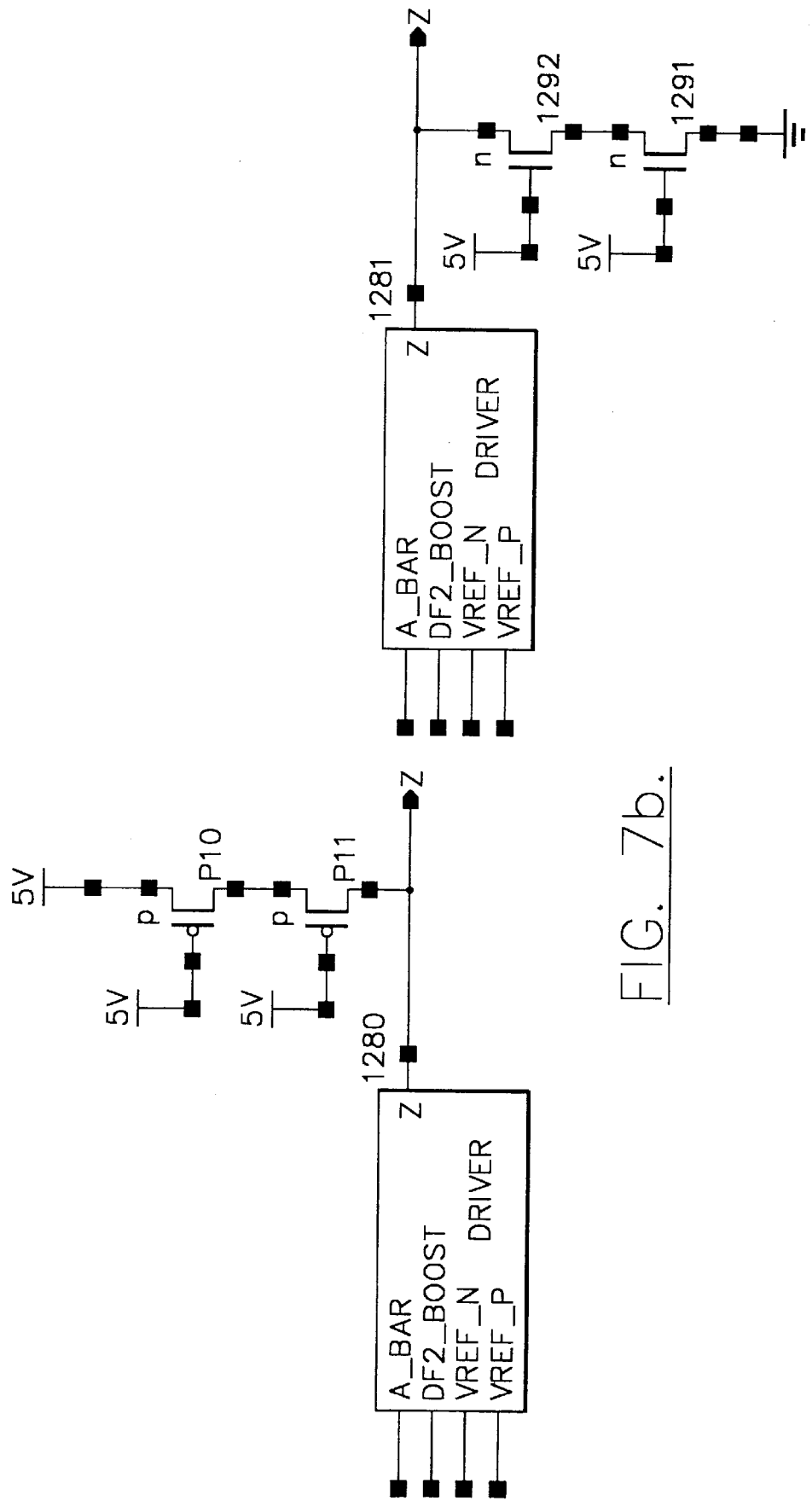

To this end, is directed the unique coupling of the overdriving stage with the level lifting stage, so as to exploit the nodes thereof that more quickly reach the new state following a transition (switching) of the input node A. When implementing the invention in a 5V CAPABLE output section of a bi-directional I/O cell, the output buffer can be further provided with pull-down or pull-up structures, as schematically shown in FIG. 7b. When the output section of the bi-directional cell is disabled, the pull-down or pull-up circuits assign a high or a low logic value, respectively, to the node z that constitutes the input of the input section of the bi-directional cell.

In this kind of bi-directional cells is implemented an enabling function that permits the use of the interfacing cell either as an output or as an input cell. The input portion of such bi-directional cells must be realized so as to withstand the high supply voltage, according to any of the known techniques. The description of such an input portion of the cell's circuit is not included here because it is not pertinent to the subject matter of the present invention neither it is necessary for a thorough comprehension of the invention.

By referring to FIGS. 5, 6 and 7a (or 7b), on a fall down front of A, the node A1 is the one that more rapidly reaches ground potential, while on the rise up front of A, the compensation function of the term VTp, superfluous in the drain follower stage, is activated by means of the transistor MD4, which quickly reduces the gate voltage of the transistor P10 to a value approximately equal to Vref_p. Moreover, on the fall down front of A, the output node is rapidly discharged through the transistor N7, along a direct path.

In terms of speed of propagation, the signal paths no longer comprise, as in the known circuits, the voltage lifting stage, thus increasing considerably the performances of the circuit of the invention in comparison with a prior art circuit. In the present context, an improvement of the performances means:

1) possibility of interfacing high supply voltage circuits with optimized low voltage circuits, without the risk of deteriorating the gate oxide layer;
2) minimizing the loss of propagation speed in lifting the voltage from VDD low to VDD high;
3) sufficient speed and drive capability for a large number of applications; and
4) flexibility of the circuit to interface also with voltage levels different from those presently used (3.3V and 5V), for example between 2.0V and 3.3V, or others.

Figure 8:
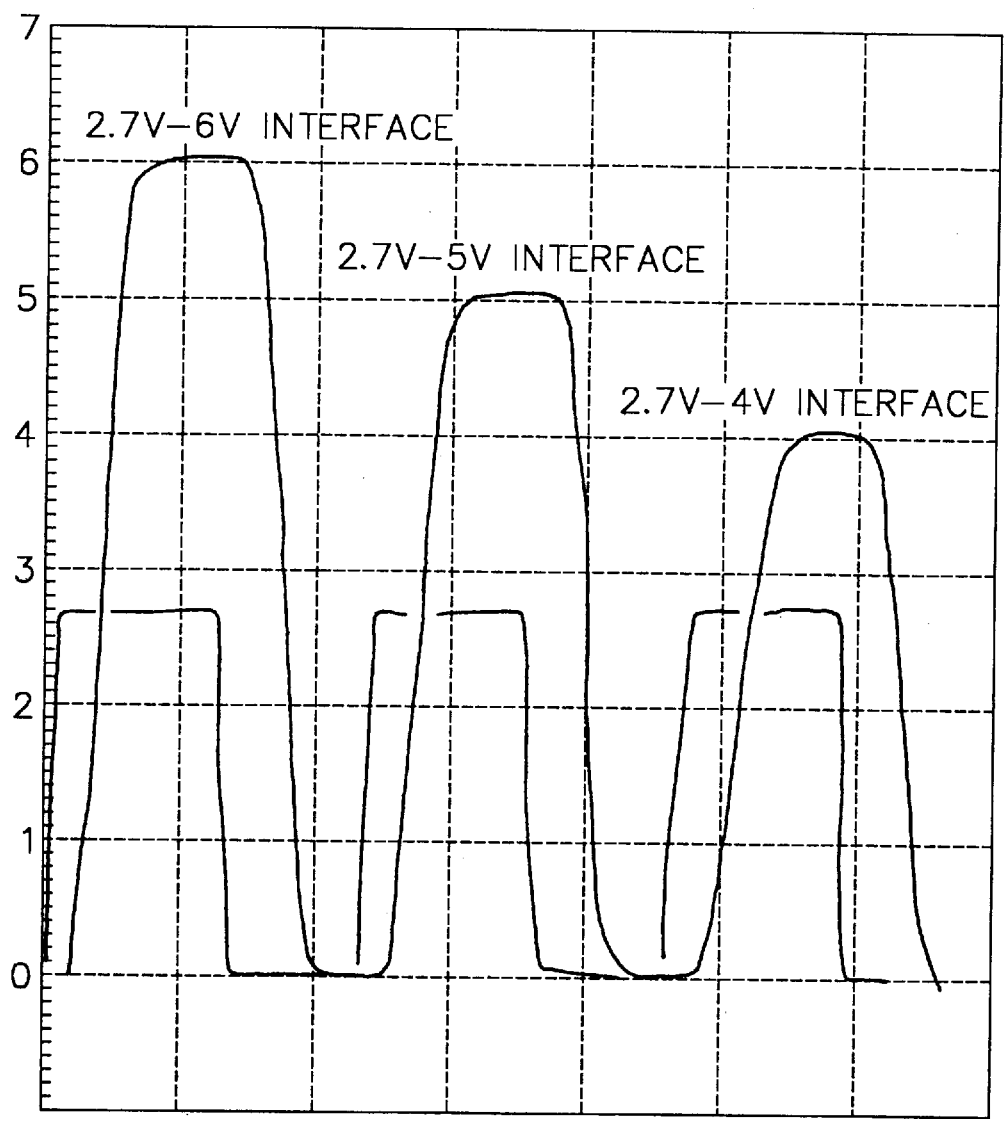
FIG. 8 shows diagrams of operation of the present invention obtained by computer simulation.

FIG. 8 shows operating diagrams obtained by computer simulation of a circuit like that illustrated in FIG. 5, for the conditions indicated and a data stream frequency of 20 MHz. According to a further aspect of the invention, it is possible to further improve the performances of the interface by also overcoming some limitations of the above described embodiments.

From equations 1.1 and 1.2 we note that the minimum voltage value applicable to the gates of the p-channel transistors is given by:

$$Vref\_p >= VDD\ high - VMAX$$

According to the above described embodiments, the reference voltage Vref_p is obtained as a fixed fraction of the VDD high voltage. This does not guarantee an ideal condition under all the conditions. For example, assuming VMAX=4.0V, and Vref_p=2/6*VDD high we would have:

|              | 4.5 | 5.0 | 6.0 |
|--------------|-----|-----|-----|
| VDD high     | 4.5 | 5.0 | 6.0 |
| Vref_p       | 1.5 | 1.6 | 2.0 |
| Vref_p ideal | 0.5 | 1.0 | 2.0 |

The deviation from the theoretical minimum for Vref_p, that is, the deviation from a condition of maximum performance is rather marked. Even for Vref_n we would have a similar deviation from the theoretical maximum value and that reached by the circuit of FIGS. 4c–8.

|              | 2.7 | 3.3 | 3.6 |
|--------------|-----|-----|-----|
| VDD low      | 2.7 | 3.3 | 3.6 |
| Vref_n       | 2.7 | 3.3 | 3.6 |
| Vref_n ideal | 4.0 | 4.0 | 4.0 |

A considerable improvement of the performances by generating a reference voltage equal to VMAX, to be used as Vref_n and a Vref_p reference voltage equal to:

$$Vref\_p = VDD\ high - VMAX$$

A circuit that will realize the above conditions is marginally more complex, but it may be considered that part of the circuit could be shared by a plurality of interfacing cells towards a high voltage, for example by integrating a reference voltage generator for each row of I/Os on the chip, or for portions of each row. Such reference voltage generators could be physically realized for example in "corner areas" of the chip, where there is usually space available or in a so-called core cell.

Figure 9:
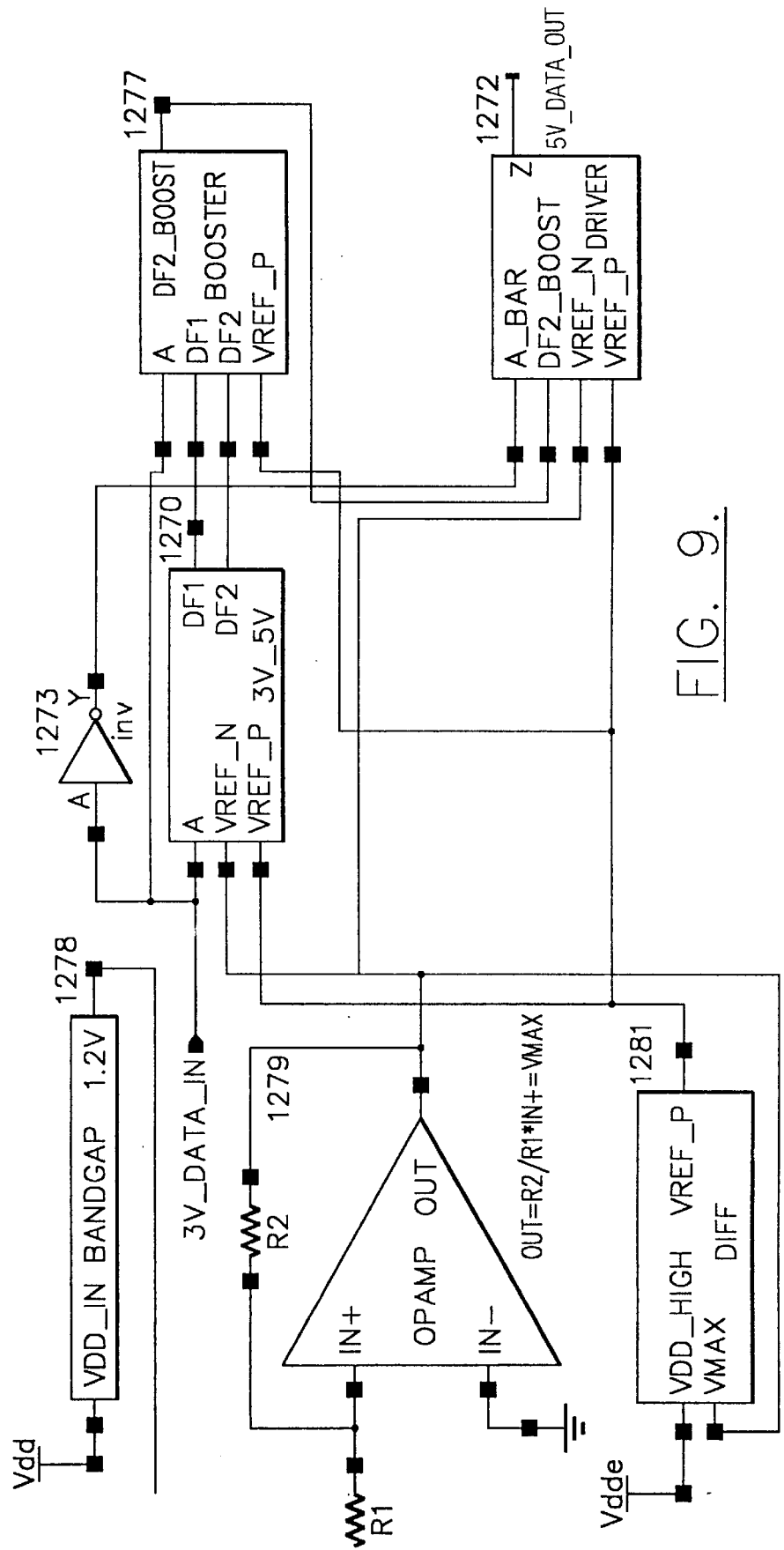
FIG. 9 is a block diagram of the present invention of a most efficient embodiment of a 3V–5V interface according to the invention.

FIG. 9 shows the logic blocks that would realize such a dedicated reference generator. First of all, a bandgap cell is used to produce a fixed reference voltage, given by the voltage between the base and the emitter of a parasitic bipolar transistor, therefore independent of the supply voltage and equal to about 1.2V. Such value is then increased up to VMAX by an operational amplifier OP AMP connected in a noninverting configuration and having a voltage gain given by:

$$Vout = R2/R1 * Vin+$$

An output voltage, independent of the supply voltage and determined only by the respective value of the resistors R2 and R1 is obtained. The so obtained VMAX voltage can be used as Vref_n so as to ensure the reaching of the theoretically permissible limit.

Finally a DIFF structure may be used to produce a static difference between the VDD high voltage and VMAX in order to provide the other reference voltage required Vref_p. Even in this case, the reaching of the maximum theoretical value is ensured.

Intuitively, the circuit of the invention, according to the alternative embodiments shown in FIG. 3 and in FIG. 9, may conveniently have an expandable modular structure. For example, the overdriving stage (FIG. 6) can drive in parallel more output buffers, or a parallel arrangement of the three modules in cascade, namely: the level lifter stage, the overdriving stage and the output buffer, respectively, may be realized. More generally, combinations of circuit blocks realized according to the invention are possible, to satisfy speed and load specifications of the interface required for a particular application.

I claim:

1. An interface circuit for coupling an integrated circuit functioning at a first supply voltage (VCC1) to a node subject to voltage excursions of amplitude substantially equal to a second supply voltage (VCC2) higher than the first supply voltage of the integrated circuit, the interface circuit comprising:

reference voltage generating means for generating a first reference voltage (Vref_p) and a second reference voltage (Vref_n);

a level lifting stage having a cascode structure comprising a first n-channel section comprising an n-channel cascoding transistor having a gate coupled to said second reference voltage (Vref_n) and a second p-channel section comprising a p-channel cascoding transistor having a gate coupled to said first reference voltage (Vref_p), said level lifting stage being driven by an input data signal (A) and by an inverted input data signal (AN) for producing respective first and second output signals (DF1 and DF2) both switching between the second supply voltage (VCC2) and a voltage defined by a difference between the second supply voltage (VCC2) and the second reference voltage (Vref_p) plus a voltage drop (Vp) through a p-channel transistor of said second p-channel section;

at least one output buffer stage having a cascode structure and comprising an n-channel section comprising an n-channel cascoding transistor having a gate coupled to the first reference voltage (Vref_n) and a p-channel section comprising a p-channel cascading transistor having a gate coupled to the second reference voltage (Vref_p), said at least one output buffer stage further comprising a p-channel pull-up device; and an overdriving stage for the p-channel pull-up device of said at least one output buffer stage and comprising an n-channel diode functionally connected between a driving node of said p-channel pull-up device and the second output signal (DF2) of said level lifting stage, and a drain follower stage comprising a pull-up device driven by the first output signal (DF1) of said level lifting stage and a pull-down device driven by the inverted input signal (AN).

2. The interface circuit as defined in claim 1, wherein said drain follower stage comprises a p-channel section comprising a p-channel cascoding transistor having a gate coupled to the first reference voltage (Vref_p) and an n-channel section comprising at least one n-channel diode.

3. The interface circuit as defined in claim 1, wherein said reference voltage generating means comprises means for generating the second reference voltage (Vref_n) to be equal to the first supply voltage (VCC1).

4. The interface circuit as defined in claim 1, wherein said reference voltage generating means comprises:

a bandgap cell for producing a basic reference voltage independent of the supply voltage;

an operational amplifier (OP AMP) in a non-inverting configuration and having an input connected to said bandgap cell for producing an output voltage (VMAX) proportional to the basic reference voltage for use as the second reference voltage (Vref_n); and a circuit having respective inputs for the second supply voltage (VCC2) and the output voltage (VMAX) produced by said operational amplifier and for producing as an output the first reference voltage (Vref_p) to be equivalent to the difference between the second supply voltage (VCC2) and the output voltage (VMAX).

5. An interface circuit for coupling a circuit functioning at a first supply voltage (VCC1) to a node subject to voltage excursions of amplitude substantially equal to a second supply voltage (VCC2) higher than the first supply voltage, the interface circuit comprising:

reference voltage generating means for generating a first reference voltage (Vref_p) and a second reference voltage (Vref_n);

a level lifting stage having a cascode structure comprising a first n-channel section comprising an n-channel cascoding transistor having a gate coupled to said second reference voltage (Vref_n) and a second p-channel section comprising a p-channel cascading transistor having a gate coupled to said first reference voltage (Vref_p), said level lifting stage being driven by an input data signal (A) and by an inverted input data signal (AN) for producing respective first and second output signals (DF1 and DF2) both switching between the second supply voltage (VCC2) and a voltage defined by a difference between the second supply voltage (VCC2) and the second reference voltage (Vref_p) plus a voltage drop (Vp) through a p-channel transistor of said second p-channel section;

at least one output buffer stage having a cascode structure and comprising an n-channel section comprising an n-channel cascading transistor having a gate coupled to the first reference voltage (Vref_n) and a p-channel section comprising a p-channel cascading transistor having a gate coupled to the second reference voltage (Vref_p), said at least one output buffer stage further comprising a p-channel pull-up device; and an overdriving stage for the p-channel pull-up device of said at least one output buffer stage and comprising an n-channel diode functionally connected between a driving node of said p-channel pull-up device and the second output signal (DF2) of said level lifting stage, and a drain follower stage comprising a pull-up device driven by the first output signal (DF1) of said level lifting stage and a pull-down device driven by the inverted input signal (AN), said drain follower stage comprising a p-channel section comprising a p-channel cascoding transistor having a gate coupled to the first reference voltage (Vref_p) and an n-channel section comprising at least one n-channel diode.

6. The interface circuit as defined in claim 5, wherein said reference voltage generating means comprises means for generating the second reference voltage (Vref_n) to be equal to the first supply voltage (VCC1).

7. The interface circuit as defined in claim 5, wherein said reference voltage generating means comprises:

a bandgap cell for producing a basic reference voltage independent of the supply voltage;

an operational amplifier (OP AMP) in a non-inverting configuration and having an input connected to said bandgap cell for producing an output voltage (VMAX) proportional to the basic reference voltage for use as the second reference voltage (Vref_n); and a circuit having respective inputs for the second supply voltage (VCC2) and the output voltage (VMAX) produced by said operational amplifier and for producing as an output the first reference voltage (Vref_p) to be equivalent to the difference between the second supply voltage (VCC2) and the output voltage (VMAX).

8. A bi-directional input/output (I/O) cell comprising:

an output section comprising an interface circuit for coupling a circuit functioning at a first supply voltage (VCC1) to a node subject to voltage excursions of amplitude substantially equal to a second supply voltage (VCC2) higher than the first supply voltage, the interface circuit comprising:

reference voltage generating means for generating a first reference voltage (Vref_p) and a second reference voltage (Vref_n);

a level lifting stage having a cascode structure comprising a first n-channel section comprising an n-channel cascading transistor having a gate coupled to said second reference voltage (Vref_n) and a second p-channel section comprising a p-channel cascoding transistor having a gate coupled to said first reference voltage (Vref_p), said level lifting stage being driven by an input data signal (A) and by an inverted input data signal (AN) for producing respective first and second output signals (DF1 and DF2) both switching between the second supply voltage (VCC2) and a voltage defined by a difference between the second supply voltage (VCC2) and the second reference voltage (Vref_p) plus a voltage drop (Vp) through a p-channel transistor;

at least one output buffer stage having a cascode structure and comprising an n-channel section comprising an n-channel cascading transistor having a gate coupled to said first reference voltage (Vref_n) and a p-channel section comprising a p-channel cascading transistor having a gate coupled to the second reference voltage (Vref_p), said at least one output buffer stage further comprising a p-channel pull-up device; and an overdriving stage for the p-channel pull-up device of said at least one output buffer stage comprising an n-channel diode functionally connected between a driving node of said p-channel pull-up device and the second output signal (DF2) of said level lifting stage, and a drain follower stage comprising a pull-up device driven by the first output signal (DF1) of said level lifting stage and a pull-down device driven by the inverted input signal (AN); and an input section connected to said output section, said input section capable of withstanding the second reference voltage (VCC2).

9. The bi-directional I/O cell as defined in claim 8, wherein said drain follower stage comprises a p-channel section comprising a p-channel cascoding transistor having a gate coupled to the first reference voltage (Vref_p) and an n-channel section comprising at least one n-channel diode.

10. The bi-directional I/O cell as defined in claim 8, wherein said reference voltage generating means comprises means for generating the second reference voltage (Vref_n) to be equal to the first supply voltage (VCC1).

11. The bi-directional I/O cell as defined in claim 8, wherein said reference voltage generating means comprises:

a bandgap cell for producing a basic reference voltage independent of the supply voltage;

an operational amplifier (OP AMP) in a non-inverting configuration and having an input connected to said bandgap cell for producing an output voltage (VMAX) proportional to the basic reference voltage for use as the second reference voltage (Vref_n); and a circuit having respective inputs for the second supply voltage (VCC2) and the output voltage (VMAX) produced by said operational amplifier and for producing as an output the first reference voltage (Vref_p) equivalent to the difference between the second supply voltage (VCC2) and the output voltage (VMAX).

* * * * *